United States Patent [19]

Lopez et al.

[11] Patent Number: 5,270,723
[45] Date of Patent: Dec. 14, 1993

[54] NEAR FIELD ANTENNA MEASUREMENT SYSTEMS AND METHODS

[75] Inventors: Alfred R. Lopez; Paul H. Feldman, both of Commack; Joseph B. Gencorelli, Lindenhurst; Gary Schay, Stony Brook, all of N.Y.

[73] Assignee: Hazeltine Corporation, Greenlawn, N.Y.

[21] Appl. No.: 958,607

[22] Filed: Oct. 8, 1992

Related U.S. Application Data

[63] Continuation of Ser. No. 591,698, Oct. 2, 1990, abandoned, which is a continuation-in-part of Ser. No. 339,560, Apr. 13, 1989, abandoned.

[51] Int. Cl.$^5$ .................. G01R 29/10; H01Q 13/10
[52] U.S. Cl. ...................... 343/703; 343/771
[58] Field of Search .......... 342/35, 173, 174, 411, 342/413; 343/703, 771, 786, 776–778, 853, 767, 770

[56] References Cited

U.S. PATENT DOCUMENTS

| | | | |
|---|---|---|---|
| 3,879,733 | 4/1975 | Hansen et al. | 343/703 |
| 4,554,551 | 11/1985 | Frazita | 343/703 |
| 4,704,614 | 11/1987 | Poirier et al. | 343/703 |
| 4,864,315 | 9/1989 | Mohuchy | 343/703 |
| 4,926,186 | 5/1990 | Kelly et al. | 342/173 |
| 5,041,840 | 8/1991 | Cipolla et al. | 343/786 |
| 5,119,105 | 6/1992 | Ngai et al. | 343/703 |

FOREIGN PATENT DOCUMENTS

| | | | |
|---|---|---|---|
| 1377770 | 2/1988 | U.S.S.R. | 343/703 |
| 1462212 | 2/1989 | U.S.S.R. | 343/703 |

OTHER PUBLICATIONS

IEEE, Test Procedure for Antennas, IEEE No. 149, Jan. 1965, 32 pages.

*Primary Examiner*—Rolf Hille
*Assistant Examiner*—Peter T. Brown
*Attorney, Agent, or Firm*—E. A. Onders

[57] ABSTRACT

A field monitor in the near field receives an antenna signal which approximates that which would be received by the monitor if located in the far field. In one aspect of the invention, the antenna signal is produced by an array of spaced apart receiving elements. In another aspect of the invention, the signal received from a near field sampling antenna is passed through a signal processor having the necessary characteristics to construct from the sample a signal corresponding to that which would have been received in the far field. Antenna element arrays are also used as plane wave sources permitting antenna testing with a radiating path length of one-eighth or one-quarter of the far field distance. Compact indoor antenna test ranges are also provided.

30 Claims, 7 Drawing Sheets

NEAR FIELD ANTENNA MEASUREMENT SYSTEMS AND METHODS

This application is a continuation of application Ser. No. 07/591,698, filed Oct. 2, 1990, now abandoned, which was a continuation-in-part of application Ser. No. 07/339,560, filed Apr. 13, 1989, now abandoned.

BACKGROUND OF THE INVENTION

This invention relates to near field antenna measurement systems generally and, more particularly, to novel systems and methods which allow a monitor in the near field to receive a signal approximating that which the monitor would receive if located in the far field. The antenna measurement systems are also usable as plane wave sources and in indoor antenna test ranges.

While the present invention is described as being especially useful with near field antenna monitors for microwave landing systems (MLS) for aircraft, it will be understood by those skilled in the art that it has other useful applications as well.

Part of a typical MLS is concerned with angle guidance for aircraft, which is accomplished through the use of two electronically scanned microwave antenna arrays—one for azimuth and the other for elevation. Distance is measured by a third element not of concern here. Because of the criticality of the application, each antenna is continuously monitored in the field in real time to measure the quality of the microwave beam. Ideally, the beam should be monitored in the far field where it is focused, that is, a distance from the antenna of at least $2D^2/\lambda$, wherein D=aperture of the transmitting device and $\lambda$=wavelength of the transmitted signal, all in feed. For a 1 degree beam width antenna, this distance is approximately 1400 feet.

In many cases, it is impractical to locate monitors in the far field; however, locating the monitor in the near field where the transmitted beam is unfocused can result in unacceptable performance, primarily due to phase errors and due to the magnification of the effects of system design tolerances. While somewhat acceptable results can be obtained with monitors located about 300 feet from the antenna, there is considerable room for improvement. Also, in some cases, even that distance is impractical and it would be desirable to be able to locate the monitor closer, say, perhaps as close as 80-90 feet and still be able to obtain acceptable results.

For antenna test ranges the far field distance of $2D^2/\lambda$ is also the distance normally used in order to obtain accurate antenna measurements. Test signals radiated from a source at that distance arrive at an antenna under test in the form of an essentially plane wave front and such plane waves are well suited for antenna evaluation. However, where use of an indoor test range is desirable to avoid distortion of test results due to atmospheric effects or spurious signals from outside sources, or for security reasons, it may not be practical to provide for a radiating path length, between the source and the antenna under test, equal to the far field distance. Recognizing that test range measurement accuracy is typically required to exceed that which may be acceptable for operational monitoring of an antenna, test range operation with a radiating path length on the order of one-quarter of the far field distance or less would be desirable.

It is, therefore, an object of the present invention to provide a method and means for locating an antenna monitor in the near field relatively close to the antenna while obtaining acceptable monitoring.

It is an additional object of the invention to provide such means that may comprise only passive components, for reliability.

It is another object of the invention to provide such method and means that can be easily and simply applied without consuming a great deal of space.

Further objects are to provide signal sources and antenna test ranges permitting antenna performance evaluation based on near field signals.

SUMMARY OF THE INVENTION

The present invention achieves the above objects, among others, by providing to a field monitor in the near field an antenna signal which approximates that which would be received by the monitor if located in the far field. In one aspect of the invention, the antenna signal is produced by an array of spaced apart receiving elements, the combined signal from such elements approximating the signal that would be received from a monitoring antenna located in the far field. In another aspect of the invention, the signal received from a near field sampling antenna is passed through a signal processor having the necessary characteristics to construct from the sample a signal corresponding to that which would have been received in the far field. In either case, the resulting signal is then the input to the monitor.

In accordance with the invention there is provided an antenna measurement system providing phase conjugate processing of near field signals for evaluating antenna performance, which includes coupling means for coupling signals and antenna means, for coupling radiated signals, comprising an antenna element configured for use in the near field region of an antenna to be measured. The system also has signal translation means for supporting the antenna means in the near field region at a position on a reference axis intersecting an antenna test position and for proportioning at least one characteristic of signal components representative of off-axis signal samples, relative to signal components representative of on-axis signal samples, so as to translate between near field type radiated signals at the antenna means and focused pattern representative signals at said coupling means whereby, near field signal translation, utilizing relative signal component characteristic proportioning of off-axis versus on-axis signal information, enables effective antenna pattern evaluation based on near field signals.

Also in accordance with the invention an antenna measurement system may utilize antenna means, for coupling radiated signals, comprising five antenna elements configured for use in the near field region of an antenna to be measured and signal translation means for supporting a first antenna element at a position on a reference axis intersecting an antenna test position, for supporting the remaining four of the elements at positions spaced from such axis in alignment with a plane intersecting the axis at a displacement from the first element, and for coupling the first element and the four elements to the coupling means with a relative difference in signal transmission values.

Further in accordance with the invention there is provided an antenna test range, utilizing phase conjugate processing of near field signals for evaluating antenna performance, which includes coupling means for coupling signals, a signal source coupled to the coupling means and antenna means comprising a plurality of antenna elements configured for use in the near field region of an antenna to be measured. The test range also includes signal translation means for supporting a first antenna element at a position on a reference axis intersecting an antenna test position, for supporting the remaining elements at positions spaced from such axis and for coupling the first element and the remaining elements to the coupling means with relative differences in phase and in signal transmission values and support means, for supporting an antenna to be tested, positioned on the axis so as to support an antenna under test at a position approximately one-quarter of the far field distance from the antenna elements. In operation of the test range, signals provided by the signal source are radiated toward an antenna under test so as to approximate a plane wave when received by such antenna after travelling a radiated distance of the order of one-quarter of the far field distance.

For a better understanding of the invention together with other and further objects, reference is made to the following description, taken in conjunction with the accompanying drawings, and its scope will be pointed out in the appended claims.

DETAILED DESCRIPTION OF THE INVENTION

Figure 1:
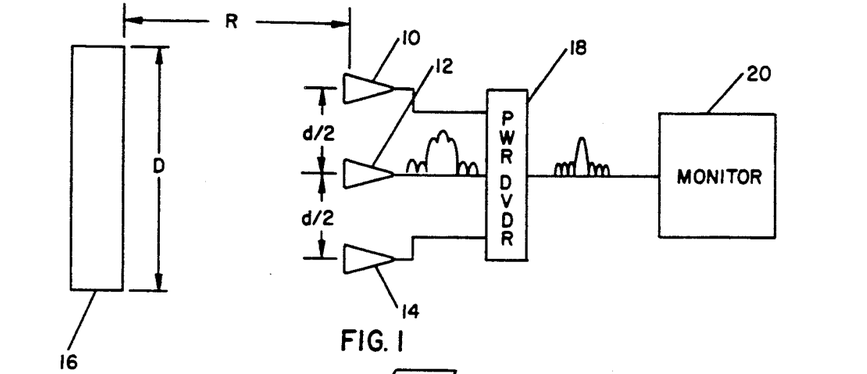
FIG. 1 schematic diagram of a field monitor system employing a sampling array according to a first embodiment the present invention.

FIG. 1 shows a schematic diagram of an antenna measurement system in the form of a monitor system employing a first type of sampling array according to the present invention which may be assumed to be located in the near field and which includes antenna means shown as three, equally spaced conventional antenna elements 10, 12 and 14 disposed in a line parallel to the major axis of an antenna 16 which is being monitored, with the center element aligned with the center of the transmitting antenna as indicated by reference axis 17. When antenna 16 is an elevation antenna, it may be assumed that FIG. 1 is an elevation view. When antenna 16 is an azimuth antenna, it may be assumed that FIG. 1 is a plan view. It will be understood that both elevation and azimuth antennas would be provided in a monitoring installation.

The FIG. 1 system also includes signal translation means, including power divider 18 and the transmission lines coupling divider 18 to the antenna elements 10, 12 and 14. As illustrated, the signal translation means is coupled between the antenna elements and coupling means, shown as transmission line section 19 which connects to monitor 20. The signals received by antenna elements 10, 12 and 14 are combined in power divider 18 of the type that is used with transmitting antennas, it being understood that elements of transmitting/receiving systems have reciprocal functions. Power divider 18 causes the off-axis signals from antenna elements 10 and 14 to be one half amplitude and lag that from antenna element 12 by 120 degrees, assuming the signal from on-axis antenna element 12 is at zero phase. The combined signal from power divider 18 is passed to monitor 10 which "sees" a signal approximating that which it would receive if the system were located in the far field.

As seen in FIG. 1, antenna elements 10 and 14 are spaced apart from antenna element 12 by a distance d/2. It has been found that acceptable results can be obtained with the embodiment shown when $d = (\frac{8}{9})(\lambda/\sin\theta)$ and $R = D^2/3\lambda$), wherein $\lambda$ = wavelength of the transmitted signal, R is the distance between the transmitting antenna 16 and antenna element 12, and $\theta$ = the angle formed between the center and the edge of the transmitting antenna 16 as viewed from antenna element 12. Where $\theta$ = arctan (D/2R), it follows that d = 4D/9. When for example, the transmitting antenna aperture D is 12 ft. and the wavelength of the signal is 2.333 inches, d = 64 inches and R = 246.9 feet. As noted above, acceptable results are obtained with three antenna elements; however, additional elements to improve the quality of the signal produced can be provided within the intent of the present invention by those skilled in the art.

While the present invention may be practiced, as described above, with three separate antenna elements feeding a power divider, it is preferable to use an antenna array which may employ a standing wave, but with which a power divider cannot cause the necessary phase shift. Antenna arrays employing standing waves are shown in perspective view in FIGS. 2 and 3 wherein antennas are illustrated for azimuth and elevation arrays, respectively, and wherein like elements are given like identifying reference numerals in both figures.

Figure 2:
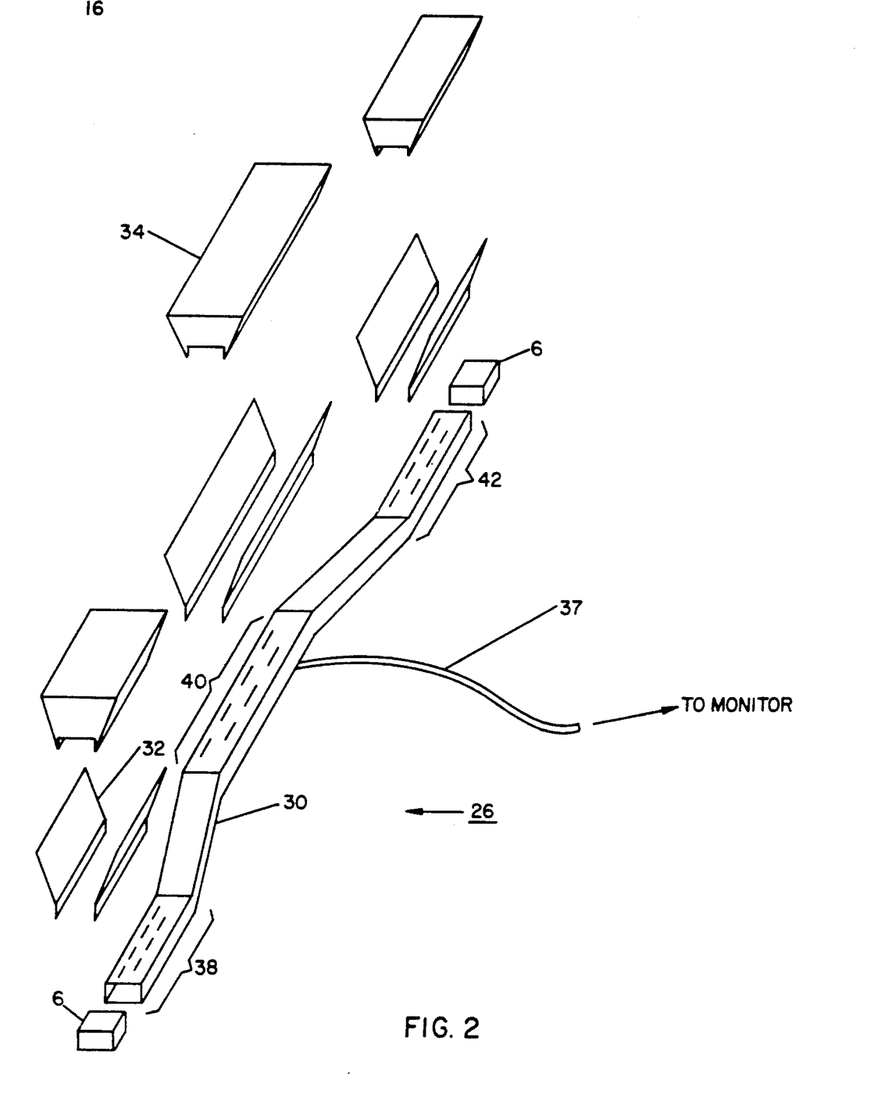
FIG. 2 is a perspective view of an azimuth focusing array according to a second embodiment of the present invention.
Figure 3:
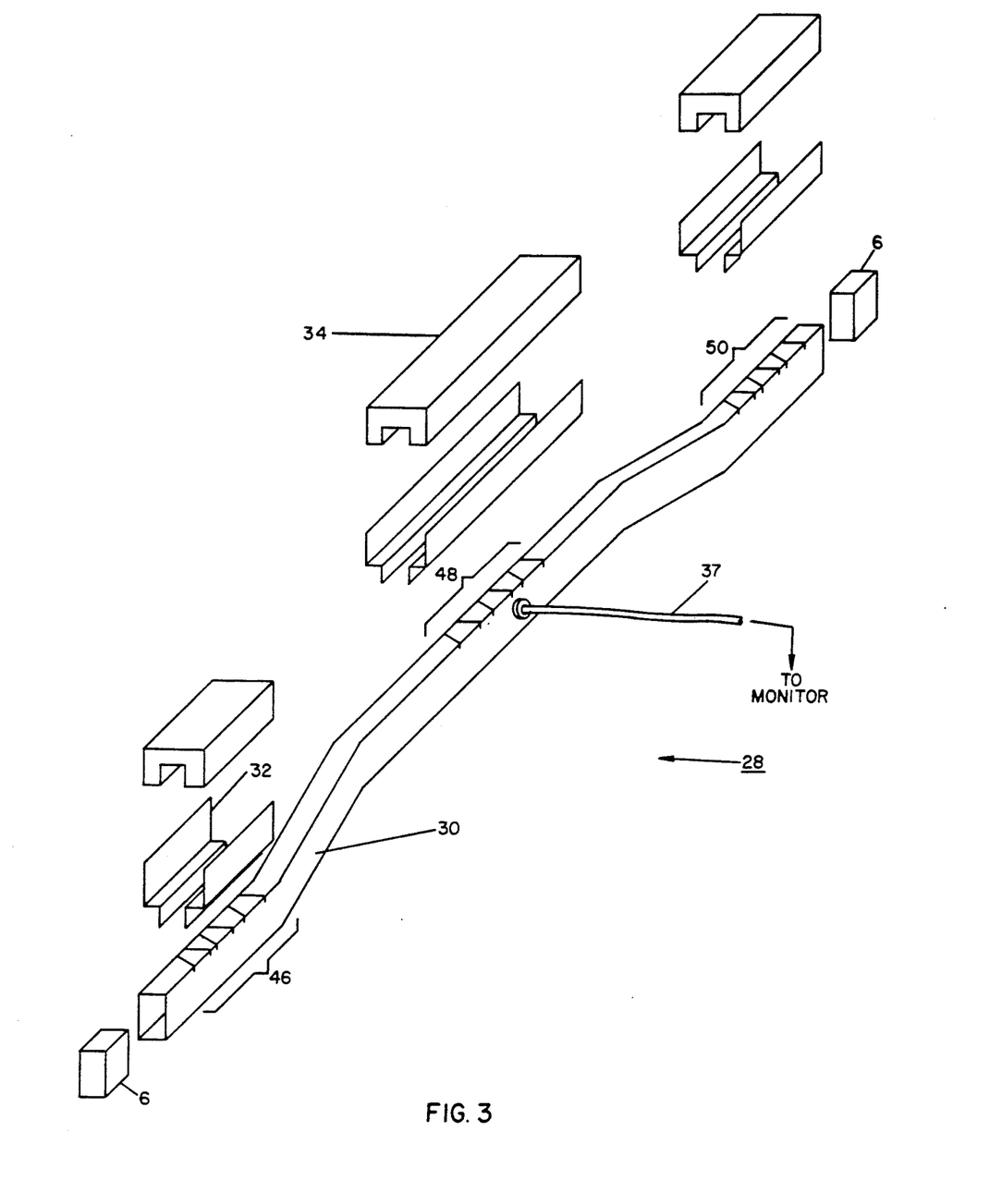
FIG. 3 is a perspective view of an elevation focusing array according to a second embodiment of the present invention.

Each antenna array, generally indicated by the reference numeral 26 or 28, includes a rectangular waveguide 30, flare elements, as at 32, closed cell foam blocks for weather protection, as at 34, and adjustable short circuit blocks 6 at each end of waveguide 30 for obtaining optimum performance. A coaxial cable 37 attached to the broad side of waveguide 30 connects the array to the monitor (not shown).

Azimuth antenna array 26 (FIG. 2) includes three elements 38, 40, 42 formed as shown, with elements 38, 40 and 42 with each element having seven or less radiating slots, all slots being formed in a broad side of waveguide 30. Elevation antenna array 28 (FIG. 3) includes three elements 46, 48 and 50 formed as shown, with each element having six or less radiating slots formed in a narrow side of waveguide 30. With both arrays 26 and 28, the outermost elements are spaced apart from the center element by a distance d/2 determined by the formula discussed above with reference to the arrangement shown in FIG. 1, i.e., $d = (\frac{2}{3})(\lambda/\sin \theta)$. In this embodiment the waveguide 30 comprises signal translation means coupling the antenna elements 38, 40 and 42 to the transmission line section 37 for coupling signals to a monitor.

As can be seen from inspection of FIGS. 2 and 3, the outermost elements are offset in a greater degree from the transmitting antenna (not shown) than the center elements by bends in the waveguides 30 to provide phase lag which cannot be attained using a power divider with a standing wave antenna. A standing wave antenna is preferred, as it provides for a high degree of phase stability. It has been found, that with the configuration shown, the offset is preferably chosen so that, when the center element is at zero phase, the outer elements each lag in phase by 105 degrees. The necessary offset to provide this phase lag is 0.68 inches.

As noted above, blocks 34 are closed cell foam. The other elements of antenna arrays 26 and 28 are preferably and conveniently formed from aluminum sheet.

Figure 4:
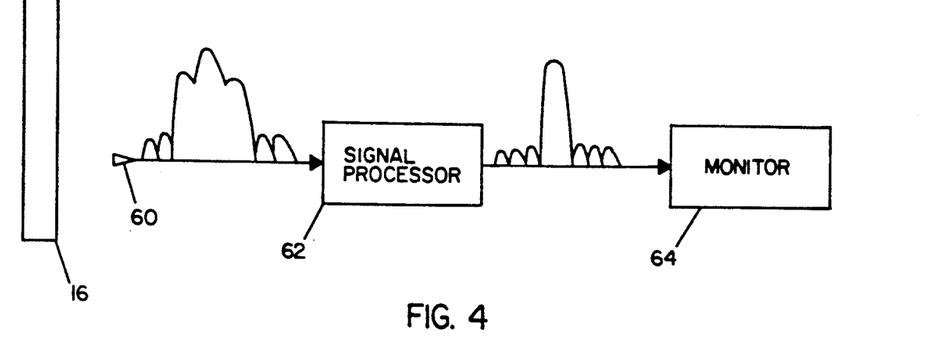
FIG. 4 is a schematic diagram of a field monitor system according to a third embodiment of the present invention.

FIG. 4 shows schematically another embodiment of the present invention, this one electronically "focusing" the signal received in the near field. Here, a beam from transmitting antenna 16 is received by monitoring antenna 60 which may be of any conventional type. As with reference to the discussion above in connection with FIG. 1, antenna 16 may be viewed as either an azimuth or elevation antenna. Monitoring antenna 60 passes the received unfocused signal pattern to a signal processor 62 which provides as its output a focused signal pattern as would be received by a monitoring antenna located in the far field, which focused signal pattern is the input to monitor 64.

Figure 5:
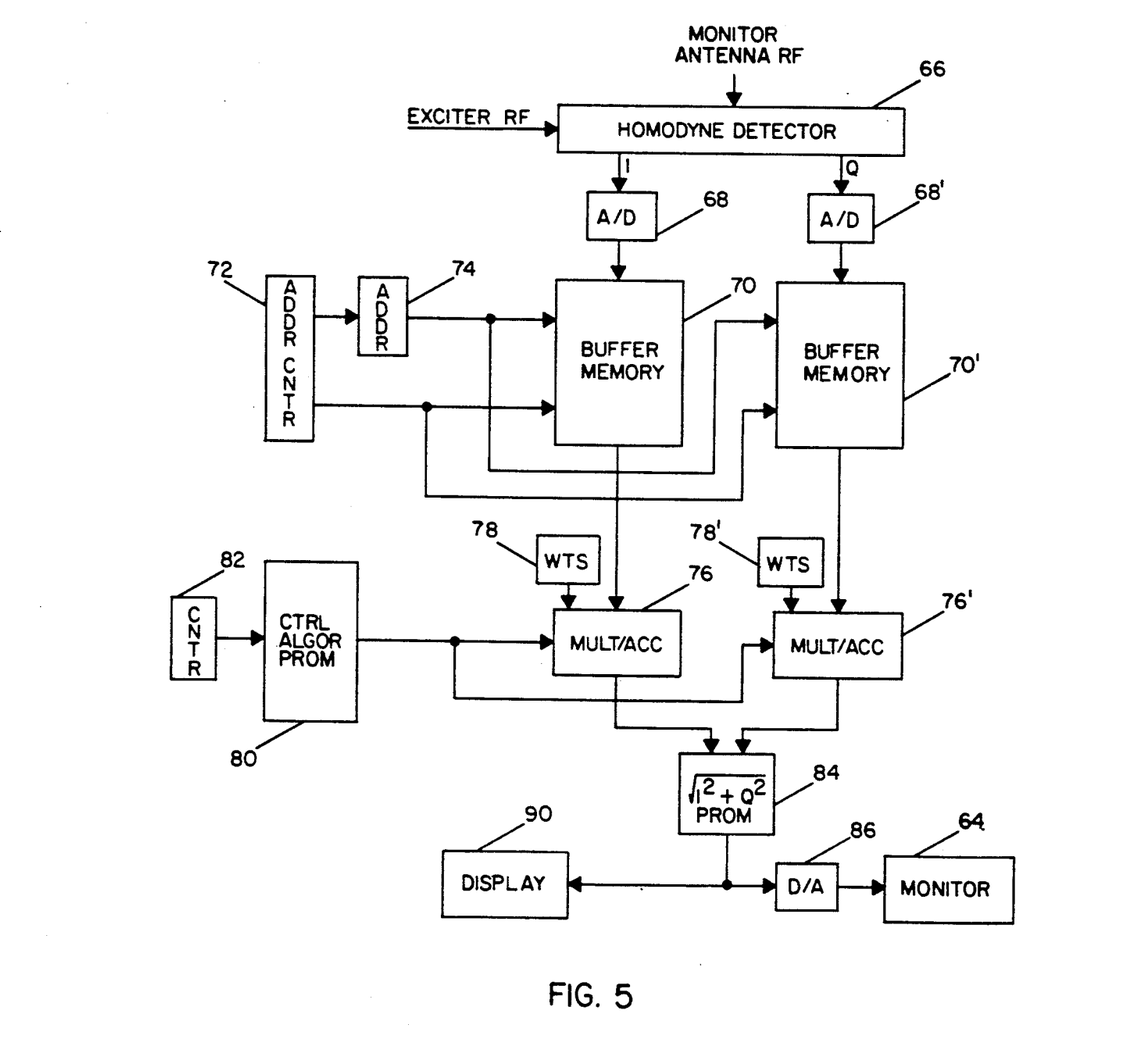
FIG. 5 is a block flow diagram illustrating the operation of the signal processor of the embodiment of FIG. 4.

FIG. 5 is a block flow diagram of signal processor 62 of FIG. 4 which receives the unfocused antenna signal and produces a signal approximating a focused signal. A homodyne detector 66 receives as inputs the monitor antenna RF signal and the exciter RF signal from the transmission system. The in-phase ("I") and quadrature ("Q") outputs of homodyne detector 66 are converted to digital signals by analog/digital converters 68 and 68', respectively, which produce bits of sample information approximately every 2 microseconds. The data bits from A/D converters 68 and 68' are stored in buffer memories 70 and 70', respectively, which may be 1K×8 RAMs. An adder/counter 72 and an adder 74 serve as a circular counter to sequentially address the data bits in buffer memories 70 and 70', and pass the data to multiplier/accumulators 76 and 76', respectively, where, in moving groups, they are sequentially multiplied by sets of weights 78 and 78', respectively, under an algorithm stored in a PROM 80 and initiated by a counter 82. The outputs from multiplier/accumulators 76 and 76' pass to a PROM 84 where they are combined in the function shown. The output of PROM 84 passes to a digital-/analog converter 86 and thence to monitor 64. If desired, the digital output of PROM 84 may be fed to a digital display 90.

Figure 6:
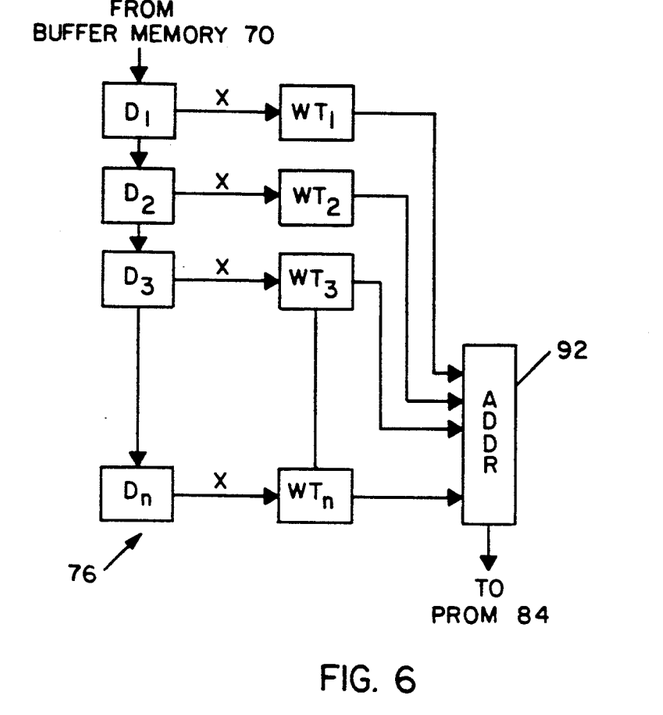
FIG. 6 is a block flow diagram illustrating the operation of a multiplier/accumulator element of the signal processor of FIG. 5.

FIG. 6 diagrammatically illustrates the function of multiplier/accumulators 76 and 76' in which a moving stream of data bits from a buffer memory, in this case buffer memory 70, for example, enters multiplier/accumulator 76 and is multiplied by weighting factors, with the products summed in adder 92 and inputted to PROM 84. The weighting factors are chosen such that the final analog signal to monitor 64 (FIG. 5) will approximate that which it would receive in the far field.

With the embodiment of the present invention shown in FIGS. 4-6, one should be able to obtain satisfactory results with a monitor installation in the near field at least as close to the transmitting antenna as 80-90 feet and possibly as close as 60 feet. Monitoring antenna locations closer than 60 feet would probably not be satisfactory, as the processing time of about 250-400 microseconds would become a significant part of the response time of the monitor. At farther distances, the processing time is small compared to the response time and the effect thereof is less significant.

Figure 7A:
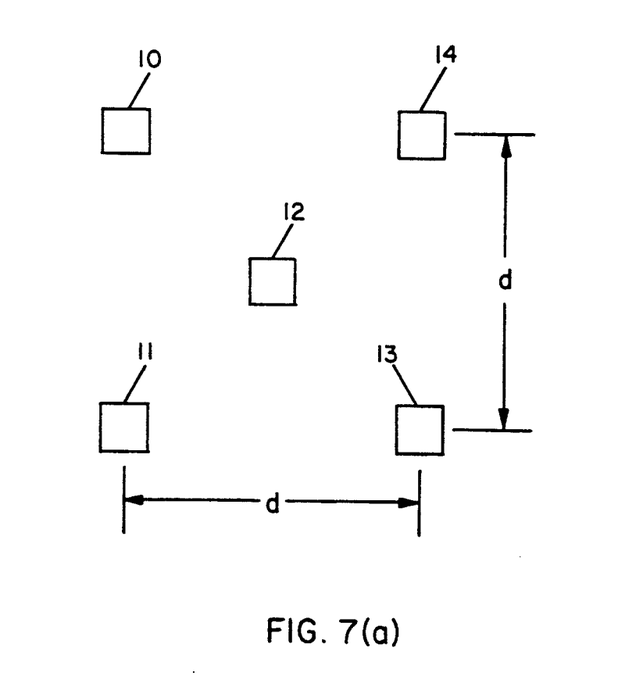
FIGS. 7(a)-7(c) include three diagrams useful in describing a fourth embodiment the invention in the form of a plane wave source including five horns.
Figure 7B:
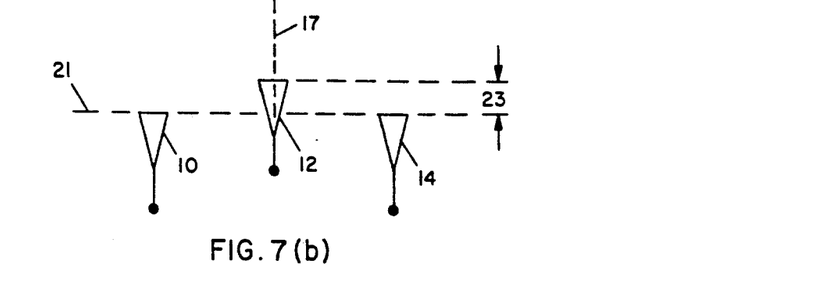
Figure 7C:
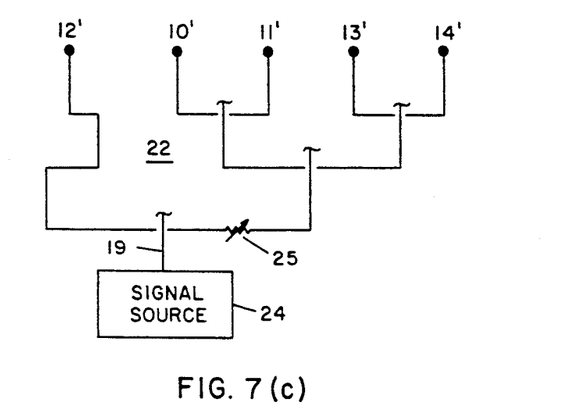

Referring now to FIG. 7, there are shown three simplified views of an embodiment of the general type shown in FIG. 1 which includes five antenna elements 10-14 supported in a three-dimensional array. FIG. 7(a) is a view of the five elements effectively looking from the test antenna 16 in FIG. 1 along reference axis 17 after replacement of the FIG. 1 three element array, power divider and monitor with the FIG. 7 five element array. FIG. 7(b) is a top view of the array of elements showing that in this embodiment the center element 12 is supported at a position on the reference axis 17 and the remaining elements are in alignment with a plane 21 which intersects reference axis 17 at a displacement 23 from the first element 12. FIG. 7(c) is a schematic diagram of the signal translation means 22 which supports the antenna elements in the positions described and also couples the first element 12 and the remaining elements 10, 11, 13 and 14 to the transmission line section 19 which connects to signal source 24. As shown, translation means 22 couples signals to element 12 with a relative difference in amplitude as compared to signals coupled to the remaining elements as a result of the presence of amplitude control 25. Control 25, which is part of the signal translation means 22, is shown as a variable resistance.

In operation, the FIG. 7 embodiment functions in accordance with the description provided in connection with FIGS. 1, 2 and 3. As earlier noted, antenna elements are reciprocal devices and in this example the FIG. 7 system will be described in the context of an energy source, rather than a signal sampling array. Whereas in FIG. 1 the power divider 18 is described as providing relative adjustments in both amplitude and phase (i.e., one-half amplitude and 120 degree phase lag) of the off-axis signal components associated with elements 10 and 14, as compared with those associated with element 12, in FIG. 7 the phase difference results from the displacement 23 and the amplitude difference results from the effect of amplitude control 25. Use of the offset or displacement 23 to achieve the desired phase difference between off-axis and on-axis signal components is as described for the waveguide offsets displacing the elements such as 38 and 42 relative to element 40 in FIG. 2. The signal translation means shown in FIG. 7(c) may utilize solid waveguides to interconnect and support the elements 10-15 or other arrangements such as flexible transmission line together with mechanical support members to provide the desired element spacing.

As shown in FIG. 7(c), signals coupled from source 24 by coupling means 19 to signal translation means 22 will be divided with essentially one-half amplitude coupled to point 12' (which feeds element 12) and one-half coupled to the amplitude control 25 and then divided equally for coupling to points 10', 11', 13' and 14' and the corresponding antenna elements. In this example all transmission line lengths from line 19 to the elements 10-14 are identical, the desired phase differential being provided by the element offset 23. In other arrangements the phase difference can be provided by a difference in line length to the central element (see FIG. 8) in place of or in conjunction with an element offset. An offset as in FIG. 7(b) may place the central element either before the other elements as shown, or trailing the other elements in order to provide a desired phase difference. It should be noted that in FIG. 7(c) a four to one amplitude difference is introduced by the branching distribution arrangement in the signal translation means 22 as shown, with the result that the amplitude control 25 may be required to provide only minor signal dissipation necessary for fine adjustment.

Figure 8:
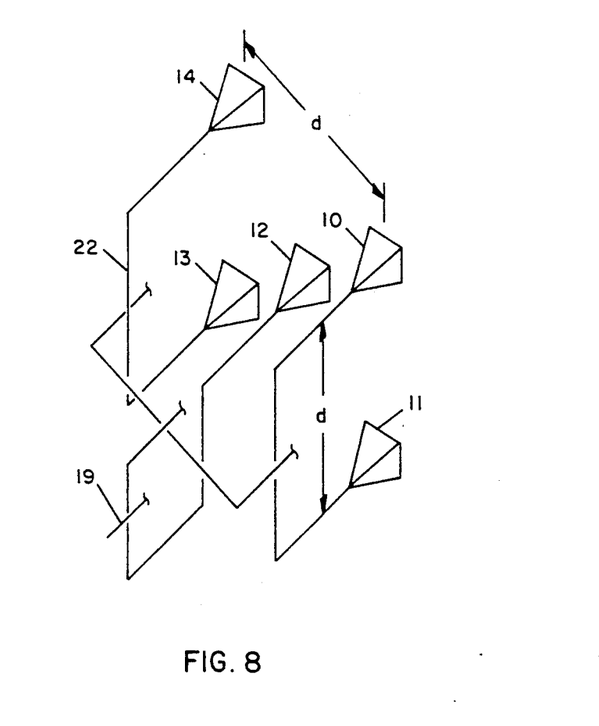
FIG. 8 is a perspective view of an alternative form of the FIG. 7 source suitable for operation over a 2 to 1 bandwidth without adjustment.

An alternative form of five horn source is illustrated in FIG. 8, which is a perspective view showing the five elements all located in the same plane (i.e. no offset or displacement relative to the central element) with the transmission line length to the central horn one-quarter wavelength longer than the equal length lines to the four outer horns. In this configuration the central horn was physically rotated 180 degrees with respect to the outer horns and no amplitude adjustment other than the four to one division was provided. Operationally, this configuration performed satisfactorily over a two to one frequency bandwidth without requiring re-adjustment of the signal translation means 22.

In operation, five horn sources of this type have been found effective to generate, at the plane of an antenna test position from a distance of one-quarter of the far field distance, a plane wave front subject to an amplitude ripple of plus or minus 0.75 dB and a phase error of 22.5 degrees across an antenna test zone twice the width of the element array. The dimensional relationships are shown in FIG. 9.

Figure 9:
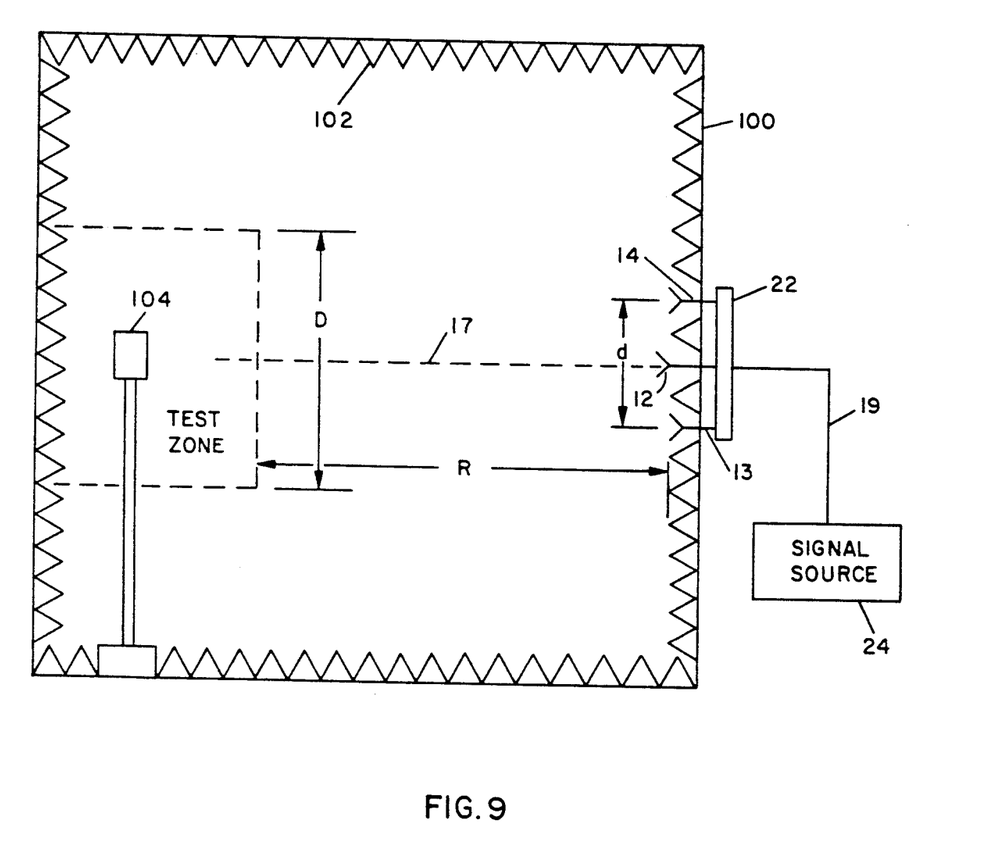
FIG. 9 is a diagram of an enclosed antenna range utilizing the FIG. 7 source.

FIG. 9 shows an indoor antenna test range including a room or enclosure 100 with an internal surface bearing anechoic signal absorption means 102. The test range includes coupling means shown as transmission line 19 coupling signal source 24 to signal translation means 22. Translation means 22 supports first antenna element 12 on reference axis 17 and the remaining four elements, represented by the elements 13 and 14 visible in this side view, spaced from the axis 17. Translation means 22 may be as shown in FIGS. 7 or 8 in order to provide the desired relative differences in phase and amplitude between the central and four surrounding elements. The test range further includes support means 104 for supporting an antenna to be tested, which may be any suitable form of structural antenna support or pedestal for holding an antenna at a desired position and alignment. It will be understood that while FIG. 9 is effectively a side view of the test range with the closest side wall removed, a top view of the test range would be essentially identical except that the support 104 would be seen in top view and the visible antenna elements would be 10, 12 and 14.

For an indoor antenna test range the basic critical dimension is the required/available radiation path length R between the element array and the test zone. An antenna to be tested must be mounted so that it falls within the dotted rectangle labeled "test zone". Thus, diameter D of the test zone is also an important dimension in determining the largest size of antenna that can be tested, however, path length R is the basic determinant of required enclosure size for test of a particular antenna. In accordance with the present invention highly accurate testing is made possible using a five element source array as discussed, while requiring a radiating path length R of only one-quarter of the far field distance of an antenna. With reference to the dimensions as indicated in FIG. 9, if the far field distance is defined as $2D^2/\lambda$, as well established in the art, and the diameter D of the test zone is twice the dimension d across the array, then path length R equals $\frac{1}{2} D^2/\lambda$ for operation as discussed. The ability to provide excellent test results with operation at distances of the order of one-quarter of the far field distance and the ability to operate over a frequency bandwidth of two to one provide advantages in both test range size and operation over all known prior sources and test ranges.

Figure 10:
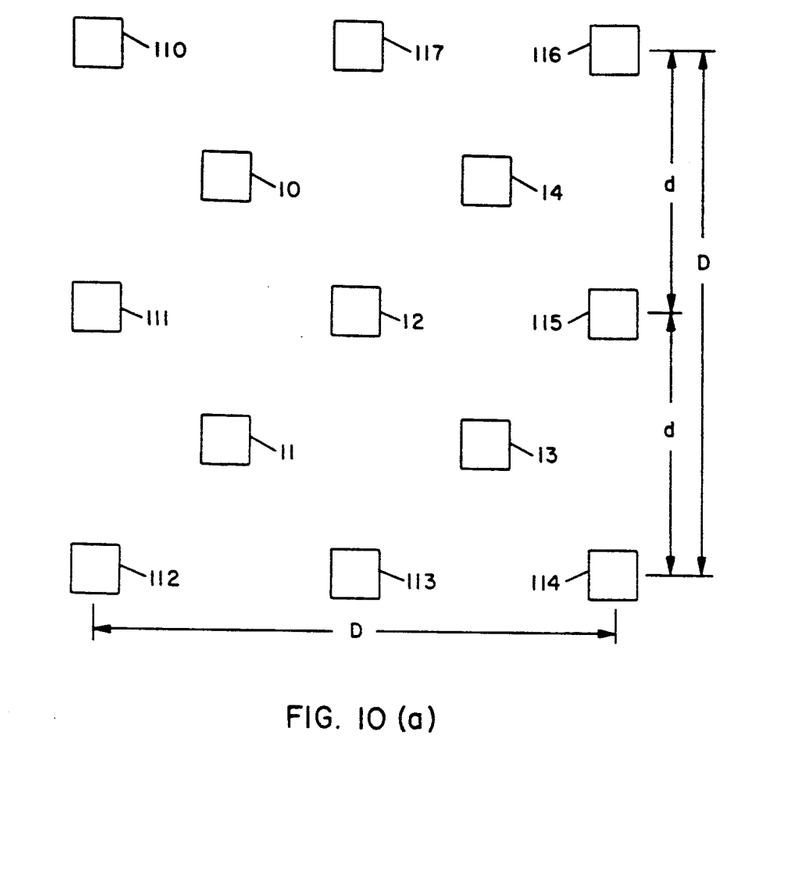
FIGS. 10(a) and 10(b) include two diagrams of a plane wave source of the type shown in FIG. 7 which utilizes an array of thirteen horns.

Referring now to FIG. 10, there is illustrated in simplified drawings a thirteen element antenna measurement system able to provide a plane wave front (with linearity errors comparable to those discussed above) with a radiation path length of only one-eighth of the far field distance. The FIG. 10 source provides the further reduced size benefit at the cost of the additional complexity of providing and intercoupling the additional eight antenna elements. As shown in FIG. 10(a) the first five elements are arranged with a first element 12 at a central point and the remaining four elements 10, 11, 13 and 14 in a square array with a dimension d on each side, centered on the on-axis element 12 which will lie on the reference axis 17 as shown in FIG. 9. As shown in FIG. 10(b) the plane of the array of elements 10, 11, 13 and 14 is displaced from the element 12 along the reference by the offset 118. Similarly, the eight additional elements 110-117 are arranged in a square array with a dimension 2d=D on each side, centered on the reference axis 17. As shown in FIG. 10(b) the plane of the array of elements 110-117 is displaced from that of elements 10, 11, 13 and 14 by the offset 120. As indicated, the overall dimension D of the FIG. 10 array corresponds to the diameter D of the usable antenna test zone in the test range. Signal translation means for the FIG. 10 antenna elements are provided in accordance with the arrangement of translation means 22 in FIGS. 7 and 8, except that one-third of the input signal is provided to element 12, one-third is equally divided among elements 10, 11, 13 and 14 and one-third is equally divided among elements 110-117, with amplitude control means included as appropriate.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

We claim:

1. An antenna measurement system using near field signals for evaluating antenna performance, comprising:
   coupling means for coupling signals to or from said antenna measurement system;
   first antenna element means, configured to couple radiated signals in the near field region of an antenna to be measured when supported in said near field region at a position on a reference axis intersecting said antenna to be measured, for coupling near field on-axis signals radiated along said reference axis;

a plurality of other antenna element means, configured to couple radiated signals in the near field region of said antenna to be measured when supported in said near field region at positions symmetrically spaced off said reference axis, for coupling near field off-axis signals radiated at a separation from said reference axis; and signal translation means, coupled between all of said antenna element means and said coupling means, for translating said near field on-axis signals with a first phase translation value and a first amplitude translation value, for translating said near field off-axis signals with a second phase translation value and a second amplitude translation value, said second phase translation value and said second amplitude translation value respectively being the same for signals associated with each of said other antenna element means, and for combining said translated on-axis and off-axis signals after said translating of said signals;

said system being configured so that said on-axis and off-axis signals are combined with predetermined phase and amplitude proportioning of said near field off-axis signals relative to said near field on-axis signals, without intercoupling of said signals in a multiport beam forming matrix, so as to translate between near field signals at said antenna element means and a far field signal representation at said coupling means.

2. An antenna measurement system as in claim 1, wherein said signal translation means couples said other element means to said coupling means via transmission paths of length different than the path coupling said first element means, said difference in transmission path lengths introducing a difference in phase of signal components representative of off-axis signal samples coupled to said other element means, relative to signal components representative of on-axis signal samples coupled to said first antenna element means.

3. An antenna measurement system as in claim 1, wherein said signal translation means couples said other element means to said coupling means via transmission paths including means for providing increased attenuation relative to a transmission path coupling said first element means.

4. An antenna measurement system using near field signals for evaluating antenna performance, comprising:
coupling means for coupling signals to or from said antenna measurement system;
first antenna element means, configured to couple radiated signals in the near field region of an antenna to be measured when supported in said near field region at a position on a reference axis intersecting said antenna to be measured, for coupling near field on-axis signals radiated along said reference axis;
a plurality of other antenna element means, configured to couple radiated signals in the near field region of said antenna to be measured when supported in said near field region at positions symmetrically spaced off said reference axis, for coupling near field off-axis signals radiated at a separation from said reference axis; and
signal translation means, coupled between all of said antenna element means and said coupling means, for translating said near field on-axis signals with a first phase translation value and a first amplitude translation value, for translating said near field off-axis signals with a second phase translation value and a second amplitude translation value, said second phase translation value and said second amplitude translation value respectively being the same for signals associated with each of said other antenna element means, and for combining said translated on-axis and off-axis signals after said translating of said signals, said signal translation means supporting said other antenna element means in alignment with a plane intersecting said reference axis at a displacement from said first antenna element means so that said displacement introduces a difference in phase of signal components representative of off-axis signal samples coupled to said other antenna element means, relative to on-axis signal samples coupled to said first antenna element means;
said system being configured so that said on-axis and off-axis signals are combined with predetermined phase and amplitude proportioning of said near field off-axis signals relative to said near field on-axis signals, without intercoupling of said signals in a multiport beam forming matrix, so as to translate between near field signals at said antenna element means and a far field signal representation at said coupling means.

5. An antenna measurement system using near field signals for evaluating antenna performance, comprising:
coupling means for coupling signals to or from said antenna measurement system;
first antenna element means, configured to couple radiated signals in the near field region of an antenna to be measured when supported in said near field region at a first position on a reference axis intersecting said antenna to be measured, for coupling near field on-axis signals radiated along said reference axis;
four other antenna element means, spaced from said first antenna element means to provide a symmetrically spaced four element array around said reference axis at a second position with a different displacement from said antenna to be measured, for coupling near field off-axis signals radiated at a separation from said reference axis; and
signal translation means, coupled between all of said antenna element means and said coupling means, for translating said near field on-axis signals with a first phase translation value and a first amplitude translation value, for translating said near field off-axis signals with a second phase translation value and a second amplitude translation value, said second phase translation value and said second amplitude translation value respectively being the same for signals associated with each of said four other antenna element means, and for combining said translated on-axis and off-axis signals after said translating of said signals;
said system being configured so that said on-axis and off-axis signals are combined with predetermined phase and amplitude proportioning of said near field off-axis signals relative to said near field on-axis signals, without intercoupling of said signals in a multiport beam forming matrix, so as to translate between near field signals at said antenna element means and a far field signal representation at said coupling means.

6. An antenna measurement system as in claim 5, wherein said signal translation means consists of interconnected sections of waveguide and an associated resistive element.

7. An antenna measurement system using near field signals for evaluating antenna performance, comprising:

coupling means for coupling signals to or from said antenna measurement system;

first antenna element means, configured to couple radiated signals in the near field region of an antenna to be measured when supported in said near field region at a first position on a reference axis intersecting said antenna to be measured, for coupling near field on-axis signals radiated along said reference axis;

other antenna element means, consisting of two antenna element means, spaced from said first antenna element means to provide a symmetrically spaced array of two elements laterally spaced from said reference axis at a second position with a different displacement from said antenna to be measured, for coupling near field off-axis signals radiated at a separation from said reference axis; and signal translation means, coupled between all of said antenna element means and said coupling means, for translating said near field on-axis signals with a first phase translation value and a first amplitude translation value, for translating said near field off-axis signals with a second phase translation value and a second amplitude translation value, said second phase translation value and said second amplitude translation value respectively being the same for signals associated with each of said two other antenna element means, and for combining said translated on-axis and off-axis signals after said translating of said signals;

said system being configured so that said on-axis and off-axis signals are combined with predetermined phase and amplitude proportioning of said near field off-axis signals relative to said near field on-axis signals, without intercoupling of said signals in a multiport beam forming matrix, so as to translate between near field signals at said antenna element means and a far field signal representation at said coupling means.

8. An antenna test range using near field signals for evaluating antenna performance, comprising:

antenna support means, positioned on a reference axis, for supporting an antenna to be tested;

a source for providing signals to be radiated;

coupling means for coupling signals from said source;

first antenna element means, supported on said reference axis at a first position at a distance of less than one-quarter of the far field distance of said antenna to be tested, for coupling on-axis signals radiated along said reference axis;

four other antenna element means, supported in spaced relation to said reference axis in a symmetrically spaced four element array around said reference axis at a second position at a distance of less than one-quarter of said far field distance, for coupling off-axis signals radiated at a separation from said reference axis; and signal translation means, coupled between all of said antenna element means and said coupling means, for translating source signals to said first antenna element means with a first phase translation value and a first amplitude translation value, for translating source signals to said four other antenna element means with a second phase translation value and a second amplitude translation value, said second phase translation value and said second amplitude translation value respectively being the same for signals associated with each of said four other antenna element means and respectively being different than one or both said first phase translation value and said first amplitude translation value;

whereby, signals from said source may be radiated toward said antenna under test so as to approximate a plane wave when received by such antenna after travelling a radiated distance of less than one-quarter of the far field distance, without any intercoupling of signals in a multiport beam forming matrix.

9. An antenna test range as in claim 8, wherein said first and second positions, as measured along said reference axis from said support means, are at the same distance from said support means.

10. An antenna test range as in claim 8, wherein said first and second positions, as measured along said reference axis from said support means, are at different distances from said support means.

11. An antenna test range as in claim 8, additionally comprising an enclosure housing all of said antenna element means and antenna support means, so as to provide a test range with both security and freedom from spurious signal and atmospheric disruption.

12. An antenna test range as in claim 8, additionally comprising an enclosure housing all of said antenna element means and antenna support means, and means for absorbing radiated energy mounted on internal surfaces of said enclosure, so as to provide a test range with both security and freedom from spurious signal and atmospheric disruption.

13. An antenna test range using near field signals for evaluating antenna performance, comprising:

antenna support means, positioned on a reference axis, for supporting an antenna to be tested;

a source for providing signals to be radiated;

coupling means for coupling signals from said source;

a first antenna element, comprising a radiating element, supported on said reference axis at a first position separated from said support means;

four additional antenna elements, each comprising a radiating element, arranged in a first array transversely spaced from said reference axis at a second position separated from said support means;

eight additional antenna elements, each comprising a radiating element, arranged in a second array transversely spaced from said reference axis at a third position separated from said support means; and signal translation means, coupled between all of said antenna elements and said coupling means, for translating source signals to said first antenna element with a first phase translation value and a first amplitude translation value and for translating source signals to said other antenna elements with difference phase translation and amplitude translation values;

whereby, signals from said source may be radiated from the near field of said antenna to be tested so as to approximate a plane wave when received by such antenna.

14. An antenna test range as in claim 13, wherein said array of four elements is spaced from said first element both along said axis and transversely to said axis.

15. An antenna test range as in claim 13, wherein said array of eight elements is spaced from said array of four elements both along said axis and transversely to said axis.

16. An antenna rest range as in claim 13, wherein a dimension, transverse to said reference axis, of said first array of four elements is approximately one-half of the largest dimension of an antenna to be tested measured transversely to said axis.

17. An antenna test range as in claim 13, wherein a dimension, transverse to said reference axis, of said array of eight elements is approximately equal to the largest dimension of an antenna to be tested measured transversely to said axis.

18. A method of providing a representation of a plane wave for antenna measurement purposes, comprising the steps of:
- positioning, along a reference axis intersecting an antenna test position, a first antenna element at a location within the near field region of an antenna to be tested;
- positioning, in spaced relationship to said reference axis, an array of additional antenna elements transversely and symmetrically spaced from said first antenna element;
- providing test signals to be radiated;
- translating to said first antenna element, for radiation by said antenna element, portions of said test signals having a first amplitude and a first phase; and
- translating to each of said additional antenna elements of said array, for radiation by said additional antenna elements, portions of said test signals having a second amplitude and a second phase, said second amplitude and second phase of said test signals as translated to each of said additional antenna elements of said array being respectively different from one or both of said first amplitude and first phase of said test signals as translated to said first antenna element;
- whereby, a near field radiated signal is provided which approximates a plane wave signal when received by said antenna to be tested.

19. A method for near field region monitoring of the performance of an antenna, comprising the steps of:
- positioning, along a reference axis intersecting an antenna test position, a first antenna element at a location within the near field region of an antenna to be tested;
- positioning, in spaced relationship to said reference axis, an array of additional antenna elements transversely and symmetrically spaced from said first antenna element;
- receiving, via said first and additional antenna elements, signals radiated by said antenna to be tested;
- translating to a coupling means, signals received by said first antenna element, subject to a first amplitude translation value and a first phase translation value;
- translating to said coupling means, independently of the preceding translating step, signals received by each of said additional antenna elements of said array, subject to a second amplitude translation value and a second phase translation value, said second amplitude translation value and second phase translation value as applied to said signals from each of said antenna elements of said array being respectively different from one or both of said first amplitude translation value and first phase translation value applied to said signals from said first antenna element;
- combining said translated signals from said first antenna element and each of said additional antenna elements of said array at said coupling means to provide a resultant received signal; and
- monitoring at least one characteristic of said resultant received signal.

20. An antenna measurement system, comprising:
- coupling means for coupling signals;
- four off-axis antenna elements, each comprising a radiating element, arranged in symmetrical array around a reference axis at a point on said reference axis;
- an on-axis antenna element, comprising a radiating element, positioned on said reference axis;
- first and second transmission line sections of similar length and transmission characteristics, said first transmission line section connected between a first pair of said four off-axis antenna elements and said second transmission line section connected between a second pair of said four off-axis antenna elements;
- a third transmission line section connected to said first transmission line section between said first pair of antenna elements and to said second transmission line section between said second pair of antenna elements;
- a fourth transmission line section connected between said third transmission line section and said coupling means; and
- a fifth transmission line section connected between said on-axis antenna element and said coupling means;
- said system being configured so that a four-to-one amplitude relationship is provided for signals coupled from said coupling means to said on-axis antenna element as compared to signals coupled to each of said four off-axis antenna elements and the phase of such signals at said on-axis antenna element relative to the phase of such signals at said off-axis antenna elements is dependent upon the lengths of said transmission line sections and the orientation and positioning of said on-axis antenna element on said reference axis.

21. An antenna measurement system, comprising:
- coupling means for coupling signals;
- four off-axis antenna elements, each comprising a radiating element, arranged in an array around a reference axis at a point on said reference axis;
- an on-axis antenna element, comprising a radiating element, positioned on said reference axis;
- first and second transmission line sections of similar length and transmission characteristics, said first transmission line section connected between a first pair of said four off-axis antenna elements and said second transmission lines section connected between a second pair of said four off-axis antenna elements;
- a third transmission line section connected to said first transmission line section between said first pair of antenna elements and to said second transmission line section between said second pair of antenna elements;
- a fourth transmission line section connected between said third transmission line section and said coupling means; and
- a fifth transmission line section connected between said on-axis antenna element and said coupling means;

said system being configured so that the total length of said transmission line sections connected between said coupling means and each of said off-axis antenna elements are all substantially equal, an approximately four-to-one amplitude relationship is provided for signals coupled from said coupling means to said on-axis antenna element as compared to signals coupled to each of said four off-axis antenna elements, and the phase of such signals at said on-axis antenna element relative to the phase of such signals at said off-axis antenna elements is dependent upon the lengths of said transmission line sections and the orientation and positioning of said on-axis antenna element on said reference axis.

22. An antenna measurement system as in claim 21, additionally comprising resistive means for adjusting the amplitude of signals in said fourth transmission line section.

23. An antenna measurement system as in claim 21, wherein the length of said transmission line section between said coupling means and said on-axis antenna element is different than the lengths of said transmission line sections between said coupling means and said four off-axis antenna elements.

24. An antenna measurement system as in claim 21, wherein each of said transmission line sections is a section of waveguide having similar transmission characteristics and each of said on-axis and off-axis antenna elements is a horn-type radiating element of similar electrical characteristics.

25. An antenna measurement system as in claim 21, wherein said on-axis antenna element is positioned on said reference axis at substantially said point around which said four off-axis antenna elements are arranged, said on-axis antenna element is substantially identical in construction to said four off-axis antenna elements, and said on-axis antenna element is oriented with a 180° rotation around said reference axis relative to the orientation of said off-axis antenna elements, said system being configured so that said 180° rotation of said on-axis antenna element introduces a 180° phase reversal of said signals at said on-axis antenna element relative to the phase of said signals at said off-axis antenna elements.

26. An antenna measurement system as in claim 25, wherein the length of said transmission line section between said coupling means and said on-axis antenna element is different than the lengths of said transmission line sections between said coupling means and said four off-axis antenna elements.

27. An antenna measurement system as in claim 25, wherein each of said transmission line sections is a section of waveguide having similar transmission characteristics and each of said on-axis and off-axis antenna elements is a horn-type radiating element having similar electrical characteristics.

28. An antenna measurement system for near field evaluation of antenna performance comprising:
coupling means for coupling signals;
first and third antenna elements arranged for operation with signals radiated in a first direction and spaced from each other transversely to said first direction;
a second antenna element positioned between said first and third antenna elements with an offset from said first and third antenna elements in said first direction; and
first and second waveguide sections respectively connected between said first and second antenna elements and said second and third antenna elements for coupling signals between said antenna elements and said coupling means with an approximately two-to-one amplitude relationship of signals from said second antenna element relative to signals from each of said first and third antenna elements;
whereby, the combined effect of phase differences resulting from said offset of said second antenna element and said approximately two-to-one amplitude relationship enables antenna performance measurements based on near field region signals.

29. An antenna array system as in claim 28, wherein said first, second and third antenna elements each comprise a similar set of longitudinal slots on the broad side of a portion of waveguide connected to and having electrical characteristics similar to said first and second waveguide sections.

30. An antenna array system as in claim 28, wherein said first, second and third antenna elements each comprise a similar set of slots across the narrow side of a portion of waveguide connected to and having electrical characteristics similar to said first and second waveguide sections.

* * * * *